July 20, 1971 B. BROYDE 3,594,170

ADDITIVES TO NEGATIVE PHOTORESISTS WHICH INCREASE THE SENSITIVITY THEREOF

Filed Oct. 3, 1968

INVENTOR
B. BROYDE
BY
MARN & JANGARATHIS
ATTORNEYS

United States Patent Office 3,594,170
Patented July 20, 1971

3,594,170

ADDITIVES TO NEGATIVE PHOTORESISTS WHICH INCREASE THE SENSITIVITY THEREOF

Barret Broyde, Highland Park, N.J., assignor to Western Electric Company, Incorporated, New York, N.Y.

Filed Oct. 3, 1968, Ser. No. 764,867
Int. Cl. B44d *1/50;* C08f *1/16*
U.S. Cl. 96—36 35 Claims

ABSTRACT OF THE DISCLOSURE

The use of a scanning electron beam to generate a pattern in a negative photoresist is known. Electron beam equipment can be made which is capable of scanning very quickly, but standard negative photoresists require such a large flux of electrons for proper exposure that the scanning equipment must be operated at speeds substantially slower than the capability of the equipment. By adding soluble, heavy organometallic compounds from Groups III–V of the Periodic Table to the photoresist, the sensitivity or speed of the photoresist is effectively increased. As a result, the electron beam can scan at a higher rate.

BACKGROUND OF THE INVENTION

(1) Field of the invention

Figure 1:
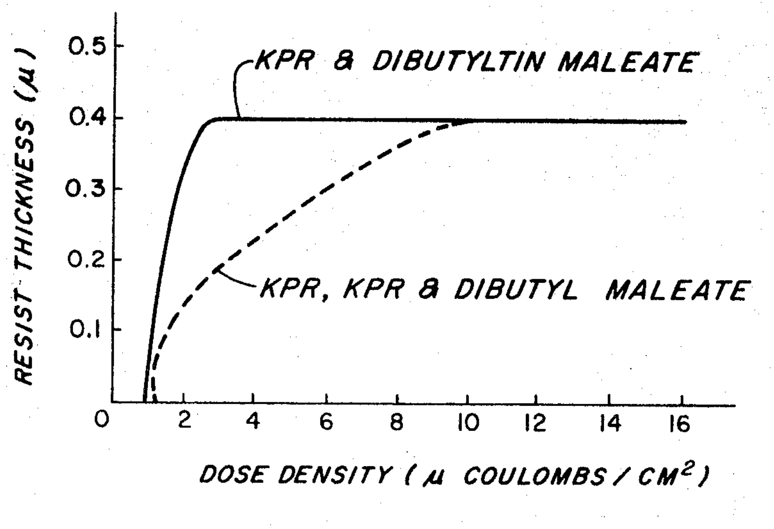

This invention relates generally to additives to negative photoresists which increase the sensitivity thereof and, more particularly, the invention relates to additives to standard negative photoresists which result in increased capture of electrons per unit flux of incident electrons, and increased reactivity of the photoresist itself. The invention has particular application in, but is not limited to, the generation of microminiature circuit patterns by electron beam exposure of negative photoresists.

A negative photoresist is an organic material which, when exposed to radiation, undergoes chemical reactions of the type referred to as crosslinking, which reactions result in insolubilizing the exposed photoresist. The crosslinking reactions are of the type that can be initiated either by light or by electrons. Because it is possible to generate electron beams of substantial energy but only $0.1\mu$ or smaller diameter, their use in the generation of extremely small circuit patterns is preferred to the use of light. Electron beams also have a much better resolution capability than is possible when using an optical mask and light exposure, and they have a much greater depth of focus. The exposure of a conventional positive photoresist involves solubilization of the exposed areas, and the chemical reactions involved are of the scission of degradation type, which also require absorption of light or electrons. Because this type of photoresist requires higher flux densities for proper exposure than negative photoresists require, electron beams are not widely employed in this service. Materials that have been successfully used as electron-sensitive positive photoresists are discussed by Haller et al., IBM Journal, May 1968, pp. 251–256.

The most common negative photoresists in current use are Kodak Photoresist (KPR, trademark) and Kodak Thin Film Resist KTFR, trademark). The KPR composition is based on the dimerization of polyvinyl cinnamate, while KTFR is based on the crosslinking of polymerized isoprene dimers. Other members of the KPR group are KPR II and III, and KOR (trademark for Kodak Ortho Resist). Another product, KMER (trademark for Kodak Metal Etch Resist) belongs to the KTFR group. The invention will be described with primary reference to use of KPR and KTFR, but it will be appreciated that it is not so limited.

The crosslinking and insolubilization of resists is a complex phenomenon, but is believed to be describable, broadly, as follows. A KPR-type resist has the following general formula:

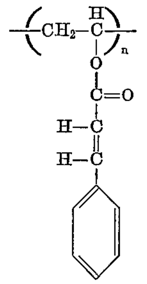

(1)

The number average molecular weight (N.A.M.W.) is 180,000–230,000, and the weight average molecular weight (W.A.M.W.) is 315,000–350,000. Upon exposure to light or electron energy, a diradical is formed:

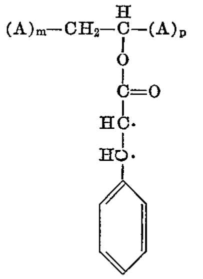

(2)

where A is the KPR monomer (structure 1 where $n=1$). The diradical then reacts with another diradical to form a 4-member ring:

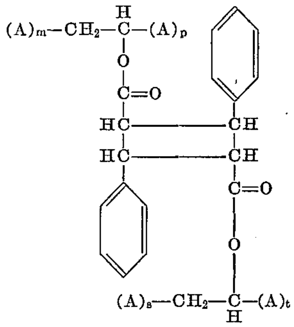

(3)

Further excitation and dimerization leads to an insoluble product; no free radicals participate in these reactions.

The KTFR-type resists can be characterized as follows:

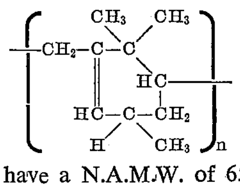

(4)

These materials have a N.A.M.W. of $65{,}000\pm 5000$ and a W.A.M.W. of about 100,000, and are insolubilized by free radical reactions. Thus, radiation produces a diradical:

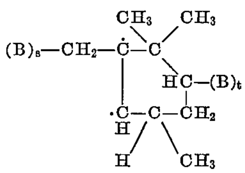

(5)

where B is the monomer of (4). The diradical reacts with other molecules until the free radical terminates. For good resolution, additives are believed to be incorporated to keep the chain short. In all of the above structural formulae, the sumscripts (*n, m, p, s, t,*) refer to integers which are determinative of molecular weight. While KPR and KTFR are insolubilized by different mechanisms, both result in crosslinked systems.

The procedures for generating a microminiature pattern circuit by electron bombardment of a photoresist are well established, and are summarized briefly below. The substrate is typically an oxidized silicon wafer or a chromium coated glass plate. The photoresist is dissolved in a suitable solvent and applied to the substrate, which may then be spun at a high speed to leave an even film of the photoresist, having a controlled thickness, on the substrate surface. Alternatively, the photoresist-solvent solution may be sprayed on. In either case, most of the solvent evaporates immediately. The photoresist-coated substrate is then dried or baked briefly to drive off any remaining solvent and to improve adhesion. The coated substrate is then placed in a vacuum chamber and, when the vacuum has been established, it is radiated in the desired pattern and with an appropriate dosage. The coated and radiated substrate is then placed in a developer, which is a solvent for the soluble portion of the resist, to dissolve and remove the unexposed portions. It is again dried or baked. The desired pattern area on the substrate is now free of any covering film, and etching, plating or oxidizing follows. After this step, the remaining resist is stripped off.

There are a variety of limitations imposed upon the radiation step, but these are fully covered in the prior art (listed below) and need only be summarized here.

Briefly, the amount of radiation must fully expose the photoresist all the way down to the substrate, or else the developed photoresist will float off when the underlying, undeveloped photoersist is dissolved in the developer. On the other hand, too much radiation will cause stripping problems and even polymer degradation. The amount of radiation necessary to form an insoluble photoresist is a function of the molecular weight of the material, and the gross amount of radiation. The efficiency of the crosslinking reactions is related to the accelerating potential of the electrons, penetration range (also a function of potential) and other factors. For instance, it has been determined that the maximum film thickness that can be developed by 5 kv. electrons is about 6500 A., and by 10 kv. electrons is about 2$\mu$. On the other hand, photoresists should initially be at least 6000 A. thick to avoid pinhole problems (a 6000 A. film will shrink to about 4000 A. when developed). Other limitations which must be considered are electron scatter within the film and backscatter from the substrate, though these are of lesser order.

(2) Prior art

Prior workers have carried extensive studies on the foregoing limitations, particularly with respect to the sensitivity and resolution capability of standard resists. This work need not be described herein, but is referenced below for background information:

Thornley et al., "Electron Beam Exposure of Photoresists," J. Electronchem. Soc., vol. 112, No. 11, November 1965, pp. 1151–1153.

Broers, "Combined Electron and Ion Beam Process for Microelectronics," Microelectronics and Reliability, vol. 4, 1965, pp. 103–104.

Kayaya et al., "Measurement of Spot Size and Current Density Distribution of Electron Probes by Using Electron Beam Exposure of Kodak Photoresist Films," Zeit. f. Licht-und Elektronioptik, vol. 25, No. 5, 1967, p. 31.

Matta, "High Resolution Electron Beam Exposure of Photoresists, Electrochemical Technology," vol. 5, Nos. 7–8, July-August 1967, pp. 382–385.

None of these prior workers have made any effort to alter conventional photoresist compositions, although it is significant to note that Thornley et al. appreciated the problems which they pose: "For serial exposures, such as may be required in printed circuit generators, the maximum exposure rates are limited by the sensitivities of presently available resists." (Thornley et al., op cit, p. 1151.)

While prior workers who have studied electron beam development of resists to generate small patterns have worked only with the available resists, workers in the field of photolithography, where photoresists were first employed, have proposed literally thousands of compounds as photopolymerization initiators, catalyzers and sensitizers. The end in view was generally to increase the sensitivity or resolution of the photoresist to light of a particular wavelength. This work is not readily summarized, but the following U.S. patents are considered representative: 2,816,091; 2,831,768; 2,861,057; 3,168,404; 3,178,283; 3,257,664; 3,331,761.

OBJECTS OF THE INVENTION

A general object of the present invention is to provide new and improved additives to negative photoresists which increase the sensitivity thereof to electrons.

A further object of the present invention is to provide additives to standard negative photoresists which result in both increased capture of electrons per unit flux of incident electrons and increased reactivity of the photoresist itself.

Another object of the present invention is to improve the sensitivity of a standard negative photoresist by including novel additives therein.

A further object of the present invention is to reduce the flux density and, hence, the exposure time required to fully expose a standard photoresist, by incorporating novel additives therein.

Various other objects and advantages of the invention will become clear from the following detailed description of several embodiments thereof, and the novel features of the invention will be particularly pointed out in connection with the appended claims.

THE DRAWINGS

Figure 2:
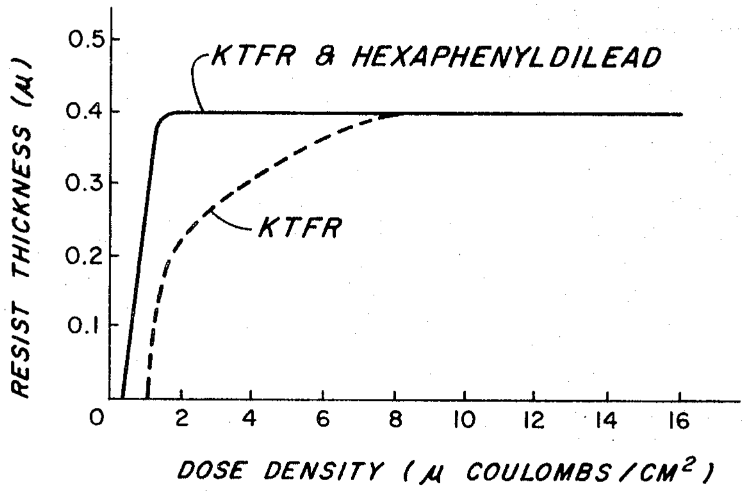

In the drawings:

FIG. 1 is a plot of resist thickness vs. flux density for exposure of 6000 A. films of KPR, KPR plus dibutyl maleate, and KPR plus dibutyltin maleate; and FIG. 2 is a plot similar to FIG. 1 for KTFR and KTFR plus hexaphenyldilead.

SUMMARY AND DESCRIPTION OF EMBODIMENTS

In essence, the present invention comprises the addition to a photoresist-solvent solution, in small amounts, of solvent-soluble organometallic compounds having a heavy metal moiety selected from Groups III, IV or V of the Periodic Table. As used herein, the term "heavy metal" is defined as a metal having an atomic number greater than about 30. The concentration of the organometallic compound in the solvent-resist solution is below 5% and is generally within the range of about 0.1 to 2% (all percentages used herein are weight percent). Concentrations above 2% will not generally be soluble in the solvent and, if the concentration exceeds the solubility limit, resolution will be lost. In the dried (solvent free) photoresist film, the organometallic concentration will be generally less than 50%.

If one knows the average molecular weight of the photoresist film and the electron accelerating potential, and makes certain assumptions regarding electron penetration, scatter and energy transfer, the gel dose of energy can be calculated from theory (the gel dose is the electron flux necessary to record an image in the film surface, i.e., the minimum dose to cause insolubility). Experimental results are in fair agreement with such calculations. Similar calculations, which take into account the presence of a heavy metal ion in the film, show that the gel dose should be lower. This is not entirely unexpected, since heavy metals are noted for their ability to stop or capture electrons (explaining the use of lead as radiation shielding). More precisely, the energy loss when an electron collides with a heavy metal is quite high, and energy transfer sites will overlap when a metal is present in the film. This means that insolubilization should be more efficient. For example, a theoretical calculation will show that an equimolar mixture (based on monomer composition) of KTFR and hexaphenyldilead, which is about a 1% solution, should absorb about 15% more energy than KTFR alone, reducing the gel dose by a corresponding amount. However, in this instance the theory fails to predict experimental results; in fact, such a mixture reduces the gel dose by about half. It is not known whether the theory is defective in some unknown manner or whether the additive participates in the cross-linking reaction in some undefined way; presumably, the theory is defective in not taking the unknown additive participation into account.

Following is a representative list of compounds which are effective in carrying out the invention:

Group III:
- cyclopentadienylthallium

Group IV:
- hexaphenyldilead
- dibutyltin maleate
- tetracyclohexyltin

Group V:
- triphenylarsine
- triphenylstilbene
- triphenylbismuth

The metallic moieties in these compounds all qualify as heavy metals, and the organic moieties insure their solubilities in the system. It will be appreciated that a variety of other compounds will meet these requirements.

Not all organometallics, however, are either operative or helpful. For example, compounds of mercury (a transition metal of Group II–*b*) such as phenyl-mercuric acetate and mercuric dibenzoate were not effective. Further, the compounds triphenyl-lead acetate, butyltin trichloride and dibutyltin dilaurate did not meet the solubility requirements. Appropriately soluble compounds of aluminum could be expected to have a minor effect on sensitivity, but its atomic number is too small for it to be significant for electron capture. As will be seen from the examples, the operable compounds are not all equivalent; some are significantly better than others.

While the dramatic decrease in gel dosage provided by these additives is in itself significant, it is not a necessary conclusion that the improvement will be of the same magnitude when the flux density necessary to expose a resist to a thickness of 3000 A. or 4000 A. is considered. More surprisingly, the magnitude of improvement is increased under these conditions. The following specific examples will illustrate this, but it is first necessary to delineate standard procedures and dosages for comparison purposes.

Both KPR and KTFR are supplied dissolved in a solvent. With the latter composition, a KTFR thinner may also be employed; this acts merely to reduce viscosity and produce a thinner film. The solvent system used for KPR is 86–87% chlorobenzene and 13–14% cyclohexanone. The KTFR solvent system is 12% ethylbenzene, 82% mixed xylenes and 6% methylcellosolve. Both systems also contain a sensitizer; in KTFR this is believed to be 2,6 bis (p-azidobenzilidene)-4-methylcyclohexanone. The KTFR thinner is primarily mixed xylenes.

To establish a basis for comparison, tests were first made with KPR and KTFR without any additives. KPR was applied to a chromium coated glass plate. This was then spun so that the resulting coating, after baking at 150° C. for 10 minutes, was 6,000 A. thick. The coated plate was then placed in a vacuum chamber and radiated with electrons accelerated at 15 kv. The plate was developed with KPR developer and baked at 150° C. for 10 minutes. The following results were obtained:

(a) Flux needed to record an image (gel dose)= $1.1\times10^{-6}$ coul./cm.$^2$.
(b) Flux needed to form 3,000 A. thick resist layer= $6\times10^{-6}$ coul./cm.$^2$.
(c) Flux needed to form maximum thickness (after development, 4,000 A.) resist=$10\times10^{-6}$ coul./cm.$^2$.

KTFR was mixed with KTFR thinner in a 1 to 3 ratio and the mixture applied to a chromium coated glass plate (or, alternatively, to a silicon slice onto which a 18,000 A. $SiO_2$ layer had been grown), and then spun to a thickness of 8,000 A. After baking at 150° C. for 10 minutes, the film was 6,000 A. thick. The coated plates were then put into a vacuum chamber and radiated with 15 kv. electrons. The plate was developed with KTFR developer and KTFR rinse, and baked at 150° C. for 10 minutes. The following results were found:

(a) Flux needed to record image (gel dose)= $0.9\times10^{-6}$ coul./cm.$^2$
(b) Flux needed to form 3000 A. film= $4\times10^{-6}$ coul./cm.$^2$
(c) Flux needed to form maximum (4000 A.) thickness=$7.5\times10^{-6}$ coul./cm.$^2$ Under identical conditions, but with 5 kv. electrons, the dose densities required to expose KTFR films are:

(a) $0.5\times10^{-6}$ coul./cm.$^2$
(b) $0.75\times10^{-6}$ coul./cm.$^2$
(c) $2\times10^{-6}$ coul./cm.$^2$

EXAMPLE I

A saturated solution (~2%) of dibutyltin maleate in KPR was prepared, and the exact same procedure was followed as outlined above. Results with 15 kv. electrons were as follows:

(a) $1.0\times10^{-6}$ coul./cm.$^2$
(b) $1.5\times10^{-6}$ coul./cm.$^2$
(c) $2.2\times10^{-6}$ coul./cm.$^2$ It will be noted that with this additive, the improvement in gel dose was only nominal (about 10%), but was substantial for exposure to 3000 A. and 4000 A.

FIG. 1 graphically illustrates the improvement in sensitivity achieved by using dibutyltin maleate as an additive. It also illustrates that dibutyl maleate, by itself, has no effect on sensitivity.

EXAMPLE II

The same tests were carried out on a film prepared from a saturated solution (~1%) of hexaphenyldilead in KTFR and thinner. Results with 15 kv. electrons were as follows:

(a) $0.5\times10^{-6}$ coul./cm.$^2$
(b) $1.0\times10^{-6}$ coul./cm.$^2$
(c) $1.5\times10^{-6}$ coul./cm.$^2$ Here, the reduction in gel dosage was 45%, and the reduction in dosage for a 4000 A. film was 5-fold. This is the most effective additive known.

FIG. 2 illustrates the rather dramatic increase in sensitivity of KTFR when hexaphenyldilead is used as an additive.

EXAMPLES III–VII

The standard procedures were repeated on five other additives in KTFR and thinner, with 15 kv. electrons, and concentrations and results as set forth below.

(III) 1% tetracyclohexyltin:
(a) $0.5\times10^{-6}$ coul./cm.$^2$
(b) $2\times10^{-6}$ coul./cm.$^2$
(c) $4\times10^{-6}$ coul./cm.$^2$ (IV) 2% triphenylbismuth:
(a) $0.85\times10^{-6}$ coul./cm.$^2$
(b) $1.5\times10^{-6}$ coul./cm.$^2$
(c) $1.85\times10^{-6}$ coul./cm.$^2$ (V) 2% triphenylstilbene:
(a) $0.7\times10^{-6}$ coul./cm.$^2$
(b) $1.85\times10^{-6}$ coul./cm.$^2$
(c) $2.5\times10^{-6}$ coul./cm.$^2$ (VI) 2% triphenylarsine:
(a) $0.7\times10^{-6}$ coul./cm.$^2$
(b) $0.9\times10^{-6}$ coul./cm.$^2$
(c) $1.85\times10^{-6}$ coul./cm.$^2$ (VII) 1% cyclopentadienylthallium:
(a) $0.5\times10^{-6}$ coul./cm.$^2$
(b) $2\times10^{-6}$ coul./cm.$^2$
(c) $3\times10^{-6}$ coul./cm.$^2$ The magnitude of improvement brought about by each of the additives is readily seen in Table I, where the percent reduction in dose for each of the three levels, as compared to the photoresist without any additives, is set forth.

TABLE I

| | Reduction in dose, percent | | |
|---|---|---|---|
| | (a) Gel dose | (b) 3,000 A. | (c) 4,000 A. |
| Example: | | | |
| I | 9.1 | 75 | 78 |
| II | 45 | 75 | 80 |
| III | 45 | 50 | 47 |
| IV | 5.5 | 63 | 75 |
| V | 22 | 54 | 67 |
| VI | 22 | 77 | 75 |
| VII | 45 | 50 | 60 |

It will be noted that one of the effects of the organometallic additives of the present invention is to increase the slope of the plot of resist thickness vs. dose density to near infinity near the gel point (see FIGS. 1 and 2). By using the minimum dose density needed to achieve the desired thickness, back-scattered electrons or scattered primary electrons are minimized if not eliminated, and resolution capability of the resist is correspondingly increased. Under these conditions, an edge definition of about 300 A. can be expected as an upper limit. This is significantly better than previously reported definition.

It will be further noted by comparing the KTFR radiated with 5 and 15 kv. electrons, that the 5 kv. samples required less energy at all three stages. It is quite true, in fact, that lower energy electrons act much more efficiently than higher energy electrons; on the average, about 2.5 times the number of molecules at each energy transfer point will react at 5 kv. than will at 15 kv. It would seem appropriate, then, to utilize lower energy electrons, but control of the size of the beam is more difficult at low energies. If very high potentials are used (+20 kv.) the efficiency of crosslinking drops too low and back-scatter can become a significant problem. For these reasons, a 15 kv. accelerating potential is preferred.

It is to be understood that various changes in the details, steps, materials and arrangements of parts, which have been herein described and illustrated in order to explain the nature of the invention, may be made by those skilled in the art within the principle and scope of the invention as defined in the appended claims and their equivalents.

What is claimed is:

1. A process for generating a pattern on a substrate comprising:
coating said substrate with a uniform thin film of a photoresist composition, said composition comprising (a) a major portion of a material selected from the group consisting of polyvinyl cinnamates and polymerized isoprene dimers, and (b) a minor portion of a solvent-soluble organometallic compound, the metallic moiety of said compound being selected from the group of metals consisting of Group IV metals of the Periodic Table having an atomic number greater than 30, Group V metals of the Periodic Table having an atomic number greater than 30, and thallium;
exposing areas of said substrate desired to be protected to sufficient electron beam radiation to crosslink and insolubilize the thin film on said areas; and
dissolving and removing the areas of said thin film not exposed.

2. The process as claimed in claim 1, wherein said organometallic compound is dibutyltin maleate.

3. The process as claimed in claim 1, wherein said organometallic compound is hexaphenyldilead.

4. The process as claimed in claim 1, wherein said organometallic compound is tetracyclohexyltin.

5. The process as claimed in claim 1, wherein said organometallic compound is triphenylbismuth.

6. The process as claimed in claim 1, wherein said organometallic compound is triphenylstilbene.

7. The process as claimed in claim 1, wherein said organometallic compound is triphenylarsine.

8. The process as claimed in claim 1, wherein said organometallic compound is cyclopentadienylthallium.

9. The process as claimed in claim 1, wherein said organometallic compound is divinyldibutyltin.

10. The process as defined in claim 1 which further comprises the step of treating the now-exposed portions of said substrate.

11. The process as claimed in claim 1, wherein said organometallic compound and said material are initially dissolved in a solvent, spread on said substrate and dried to drive off said solvent.

12. The process as claimed in claim 11, wherein the concentration of said organometallic compound in the solvent system is in the range of about 0.1% to about 5%.

13. An electron-sensitive photoresist composition comprising a polymerized isoprene dimer and less than about 50% of a solvent-soluble organometallic compound, the metallic moiety of said compound being selected from the group of metals consisting of Group IV metals of the Periodic Table having an atomic number greater than 30, Group V metals of the Periodic Table having an atomic number greater than 30, and thallium.

14. The composition as claimed in claim 13, wherein said organometallic compound is dibutyltin maleate.

15. The composition as claimed in claim 13, wherein said organometallic compound is hexaphenyldilead.

16. The composition as claimed in claim 13, wherein said organometallic compound is tetracyclohexyltin.

17. The composition as claimed in claim 13, wherein said organometallic compound is tetracyclohexyltin.

18. The composition as claimed in claim 13, wherein said organometallic compound is triphenylbismuth.

19. The composition as claimed in claim 13, wherein said organometallic compound is triphenylstilbene.

20. The composition as claimed in claim 13, wherein said organometallic compound is triphenylarshine.

21. The composition as claimed in claim 13, wherein said organometallic compound is cyclopentadienylthallium.

22. The composition as claimed in claim 13, wherein said organometallic compound is divinyldibutyltin.

23. The composition as claimed in claim 13, wherein said dimer and said organometallic compound are dissolved in a solvent system comprising ethylbenzene, mixed xylenes and methylcellosolve, the concentration of said organometallic compound in the photoresist-solvent system being less than about 5%.

24. The composition as claimed in claim 13 wherein said dimer and said organometallic compound are dissolved in a solvent system, said organometallic compound being present in said solvent system in an amount ranging from 0.1 to 5%.

25. An electron-sensitive photoresist composition comprising a polyvinyl cinnamate and less than about 50% of a solvent-soluble organometallic compound, the metallic moiety of said compound being selected from the group of metals consisting of Group IV metals of the Periodic Table having an atomic number greater than 30, Group V metals of the Periodic Table having an atomic number greater than 30, and thallium.

26. The composition as claimed in claim 25, wherein said organometallic compound is dibutyltin maleate.

27. The composition as claimed in claim 25, wherein said organometallic compound is hexaphenyldilead.

28. The composition as claimed in claim 25, wherein said organometallic compound is tetracyclohexyltin.

29. The composition as claimed in claim 25, wherein said organometallic compound is triphenylbismuth.

30. The composition as claimed in claim 25, wherein said organometallic compound is triphenylstilbene.

31. The composition as claimed in claim 25, wherein said organometallic compound is triphenylarsine.

32. The composition as claimed in claim 25, wherein said organometallic compound is cyclopentadiethylthallium.

33. The composition as claimed in claim 25, wherein said organometallic compound is divinyldibutyltin.

34. The composition as claimed in claim 25, wherein said cinnamate and said organometallic compound are dissolved in a solvent system comprising chlorobenzene and cyclohexanone, the concentration of said organometallic compound in the photoresis-solvent system being less than about 5%.

35. The composition as claimed in claim 25 wherein said cinnamate and said organometallic compound are dissolved in a solvent system, said organometallic compound being present in said solvent system in an amount ranging from 0.1 to 5%.

References Cited

UNITED STATES PATENTS

| | | | |
|---|---|---|---|
| 2,610,120 | 9/1952 | Minsk | 96—115 |
| 2,712,995 | 7/1955 | Elliott | 96—115 |
| 2,732,301 | 1/1956 | Robertson | 96—115 |
| 2,856,284 | 11/1958 | Hamm | 96—115 |
| 3,211,553 | 10/1965 | Ito | 96—36 |
| 3,432,299 | 3/1969 | Bates | 96—36 |
| 3,493,380 | 2/1970 | Rauner | 96—115 |

WILLIAM D. MARTIN, Primary Examiner

W. R. TRENOR, Assistant Examiner

U.S. Cl. X.R.

96—36.2; 156—2, 3, 13; 204—159.24.

L-566-PT
(6-69)

UNITED STATES PATENT OFFICE
CERTIFICATE OF CORRECTION

Patent No. 3,594,170 Dated July 20, 1971

Inventor(s) Barret Broyde

It is certified that error appears in the above-identified patent and that said Letters Patent are hereby corrected as shown below:

Column 1, line 52, "scission of" should read --scission or--.

Column 2, line 27, "Hо." should read --HC.--.

Column 3, line 52, "of lesser" should read --of a lesser--; line 56, "carried extensive" should read --carried out extensive--; line 62, "J. Electronchem." should read --J. Electrochem.--; line 67, "Kayaya et al," should read --Kanaya et al,--.

Column 8, claim 20, line 57, "triphenylarshine" should read --triphenylarsine--.

Column 9, claim 32, line 20, "cyclopentadiethylthallium" should read --cyclopentadienylthallium--.

Column 10, claim 34, line 2, "photoresis-solvent" should read --photoresist-solvent--.

Signed and sealed this 18th day of January 1972.

(SEAL)
Attest:

EDWARD M.FLETCHER,JR.
Attesting Officer

ROBERT GOTTSCHALK
Acting Commissioner of Patents